(12) United States Patent
Xu et al.

(10) Patent No.: US 9,306,003 B2
(45) Date of Patent: Apr. 5, 2016

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Jing Xu, Beijing (CN); Jiang Yan, Beijing (CN); Bangming Chen, Beijing (CN); Hongli Wang, Beijing (CN); Bo Tang, Beijing (CN); Zhaoyun Tang, Beijing (CN); Yefeng Xu, Beijing (CN); Chunlong Li, Beijing (CN); Mengmeng Yang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/396,709

(22) PCT Filed: Aug. 15, 2014

(86) PCT No.: PCT/CN2014/084514
§ 371 (c)(1),
(2) Date: Oct. 23, 2014

(87) PCT Pub. No.: WO2016/008195
PCT Pub. Date: Jan. 21, 2016

(65) Prior Publication Data
US 2016/0020274 A1   Jan. 21, 2016

(30) Foreign Application Priority Data

Jul. 16, 2014   (CN) .......................... 2014 1 0339812

(51) Int. Cl.
*H01L 29/06* (2006.01)
*H01L 29/165* (2006.01)
*H01L 29/78* (2006.01)
(Continued)

(52) U.S. Cl.
CPC ...... *H01L 29/0653* (2013.01); *H01L 21/02236* (2013.01); *H01L 21/02381* (2013.01); *H01L 21/02532* (2013.01); *H01L 21/30604* (2013.01);
(Continued)

(58) Field of Classification Search
CPC .................... H01L 21/2658; H01L 21/26586; H01L 21/84; H01L 27/12; H01L 29/78; H01L 29/792; H01L 29/80
See application file for complete search history.

(56) References Cited

U.S. PATENT DOCUMENTS

2012/0018809 A1* 1/2012 Huang .............. H01L 21/76264
257/348
2012/0025267 A1   2/2012 Huang et al.
2013/0256810 A1  10/2013 Yin et al.

FOREIGN PATENT DOCUMENTS

CN        1731570 A     2/2006
CN      101924138 A    12/2010
(Continued)

Primary Examiner — Kyoung Lee
(74) Attorney, Agent, or Firm — Christensen Fonder P.A.

(57) ABSTRACT

A semiconductor device, including: a substrate having a first semiconductor material; a second semiconductor layer on the substrate; a third semiconductor layer on the second semiconductor layer and being a device formation region; an isolation structure on both sides of the third semiconductor layer and on the substrate; and an insulating layer below the source and drain regions of the third semiconductor layer and between the isolation structure and the ends of the second semiconductor layer.

8 Claims, 3 Drawing Sheets

(51) Int. Cl.
  *H01L 29/66* (2006.01)
  *H01L 21/02* (2006.01)
  *H01L 21/306* (2006.01)
(52) U.S. Cl.
  CPC .......... *H01L 29/0649* (2013.01); *H01L 29/165* (2013.01); *H01L 29/66651* (2013.01); *H01L 29/78* (2013.01)

(56) References Cited

FOREIGN PATENT DOCUMENTS

| CN | 101986435 A | 3/2011 |
| CN | 103367394 A | 10/2013 |
| CN | 103579308 A | 2/2014 |

* cited by examiner

1

SEMICONDUCTOR DEVICE AND METHOD FOR MANUFACTURING THE SAME

CROSS-REFERENCE TO RELATED APPLICATION(S)

This application claims priority to a Chinese Application No. 201410339812.9, filed on Jul. 16, 2014 and entitled "SEMICONDUCTOR DEVICE AND METHOD FOR MANUFACTURING THE SAME", which is incorporated herein by reference in their entirety.

TECHNICAL FIELD

The present disclosure relates to the semiconductor device field, and particularly, to semiconductor devices and methods for manufacturing the same.

BACKGROUND

As the size of the device continues to be shrunk, the number of devices per unit area of a chip becomes continuously larger, which leads to an increase of dynamic power consumption. Meanwhile, the continuous shrinking of the size of the device leads to an increase in leakage current, which in turn increases static power consumption. When the semiconductor device is integrated at a high level and channel lengths of MOSFETs becomes shorter continuously, a series of effects which may be neglected in a long-channel model for a MOSFET becomes more significant, and even becomes a dominant factor affecting performance of a device. Such a phenomenon is generally called a short-channel effect. The short-channel effect would deteriorate electronic performance of a device, such as leading to a decrease of the threshold voltage of the gate, an increase of the power consumption a decrease of signal-to-noise ratio, and the like.

An SOI substrate is a substrate in which a silicon dioxide layer is embedded below the silicon. As compared to a bulk silicon device, the device formed by an SOI substrate may obviously reduce leakage current and power consumption to suppress the short channel effect, so such a device has a significant advantage. However, the cost for an SOI substrate is higher and it needs a larger device area to avoid a floating body effect, so it is difficult to meet the requirements of high integration of the device. In addition, since a silicon dioxide layer is embedded, heat dissipation performance is affected.

SUMMARY

An object of the present disclosure is to solve at least one of the technical defects mentioned above and to provide semiconductor devices and methods for manufacturing.

The present disclosure provides a semiconductor device, comprising: a substrate having a first semiconductor material; a second semiconductor layer on the substrate; a third semiconductor layer on the second semiconductor layer and being a device formation region; an isolation structure on both sides of the third semiconductor layer and on the substrate; an insulating layer below the source and drain regions of the third semiconductor layer and between the isolation structure and the ends of the second semiconductor layer.

Alternatively, the substrate may be a bulk silicon substrate, the second semiconductor may be $Ge_xSi_{1-x}$ (0<x<1), and the third semiconductor layer may be a silicon.

Alternatively, the insulating layer may be an oxide material, and is further formed between the isolation structure and substrate as well as between the third semiconductor layer and the isolation structure.

The present disclosure further provides a method for manufacturing a semiconductor device, comprising steps of: providing a substrate having a first semiconductor material; forming a second semiconductor layer on the substrate, and forming a third semiconductor layer on the second semiconductor layer; removing a partial of the second semiconductor layer from one end of the second semiconductor layer to form an opening; filling up the opening to form an insulating layer; forming an isolation structure on both sides of the third semiconductor layer and on the substrate; wherein the third semiconductor layer is a device formation region, and the opening is below source and drain regions of the third semiconductor layer.

Alternatively, the substrate may be a bulk silicon substrate, the step of forming the second semiconductor layer and the third semiconductor layer may comprise: epitaxially growing the second semiconductor of $Ge_xSi_{1-x}$ on the substrate, 0<x<1; epitaxially growing the third semiconductor layer of silicon; and patterning the second semiconductor layer and the third semiconductor layer.

Alternatively, the step of removing a partial of the second semiconductor layer from one end of the second semiconductor layer to form an opening may comprise: selectively removing the second semiconductor layer by a wet etching so as to form an opening at ends of the second semiconductor layer.

Alternatively, the etchant for the wet etching may be a mixed solution of HF, $H_2O_2$, $CH_3COOH$ and $H_2O$.

Alternatively, the step of forming an insulating layer in the opening may comprise oxidizing to form an insulating layer of an oxide material on exposed surfaces of the substrate, the second semiconductor layer and the third semiconductor layer and the oxide material fills up the opening.

In the semiconductor device and the method for manufacturing the same provided by the embodiment of the present disclosure, a structure with an insulating layer is formed below the source and drain region of the third semiconductor layer for the device and the semiconductor layer is below the channel region of the third semiconductor layer. Such a device structure incorporates the respective advantages of the bulk silicon device and the SOI device, and has characteristics of lower cost, smaller leakage current, lower power consumption, faster speed, simpler processing and higher integration level. Meanwhile, the floating body effect and the spontaneous heating effect are eliminated as compared with the SOI device.

BRIEF DESCRIPTION OF THE DRAWINGS

The above and/or additional aspects and advantages of the present disclosure become apparent and appreciated to be understood in the following description of the embodiments in conjunction with the accompany figures, in which.

DETAILED DESCRIPTION

An embodiment of the present disclosure will be illustrated in detail below, the example of which is shown in the accompany figures and in which identical or similar reference signs are used to represent identical or similar elements or element having identical or similar functions throughout the description. The embodiment illustrated by referring to the accompany figures is exemplified, which is not to limit but to explain the present disclosure.

Figure 6:
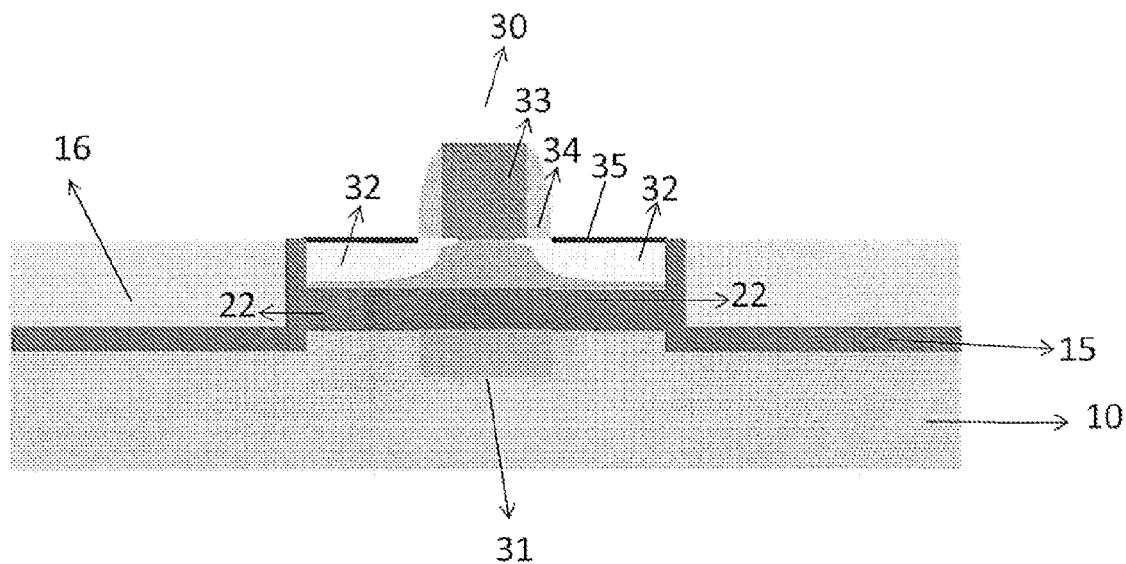

The object of the present disclosure is to provide a semiconductor device. As shown in FIG. 6, the semiconductor device may comprise: a substrate 10 having a first semiconductor material; a second semiconductor layer 11 on the substrate 10; a third semiconductor layer 12 on the second semiconductor layer 11 and being a device formation region; an isolation structure 16 on both sides of the third semiconductor layer 12 and on the substrate 10; an insulating layer 22 below the source and drain regions 31 of the third semiconductor layer and between the isolation structure 16 and the ends of the second semiconductor layer 11.

In the present disclosure, the second semiconductor layer is formed on the substrate, and the third semiconductor layer for forming the device is on the second semiconductor layer. The second semiconductor layer is only formed below the channel region of the third semiconductor layer, and the structure of an insulating layer is formed below the source and drain regions and between the second semiconductor layer and the isolation structure. Due to the presence of the insulating layer, the leakage current and power consumption of the device is prominently reduced and the integrating level of the device is increased. As compared with an SOI device, the lower portion of the channel region being connected with the substrate has a better heat dissipation property and avoids generation of the floating body effect. Meanwhile, since a bulk silicon substrate may be employed for a device, the limitation of high cost of the SOI wafer is avoided.

Furthermore, the device of the present disclosure is applicable for a high-radiation environment, such as in a strategic weapon. Since there is not an insulating layer of silicon oxide below the channel, the area of the irradiation sensitive region is decreased and a portion of the electron hole pair caused by irradiation is released by adjusting the back gate, which avoids the floating body effect caused by the irradiation.

In the present disclosure, the material for the substrate, the second semiconductor layer and the third semiconductor layer may be chosen according to the requirements of manufacturing process and device performance. Identical or different semiconductor materials may be employed. In an embodiment of the present disclosure, the substrate may be a bulk silicon substrate, the second semiconductor layer may be $Ge_xSi_{1-x}$ (0<x<1), and the third semiconductor layer may be a silicon. Such a selection of this semiconductor material facilitates to form crystals for the second and third semiconductor layers by epitaxial growth, and the device will have an excellent property.

In addition, the insulating layer may be an oxide material for the respective semiconductor layers, and may be further formed between the isolation structure and substrate as well as between the third semiconductor layer and the isolation structure. It may be formed by self-alignment.

Figure 7:
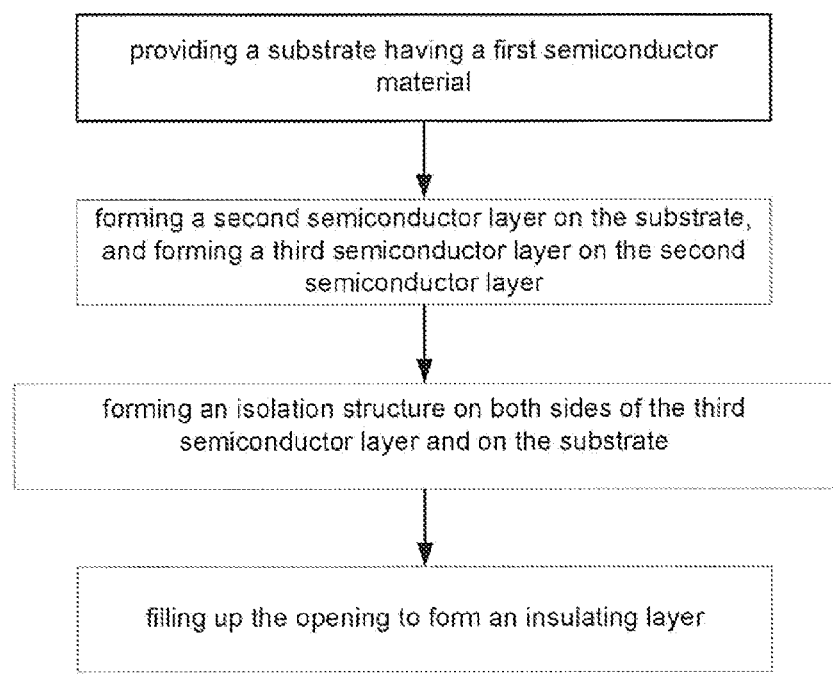
FIG. 7 shows a flowchart of a method for manufacturing the semiconductor device according to an embodiment of the present disclosure.

In addition, the present disclosure further provides a method for manufacturing the semiconductor device mentioned above. In order to better understand the technical solution and technical effect of the present disclosure, a particular embodiment will be illustrated in detail in conjunction with the flowchart of FIG. 7.

Figure 1:
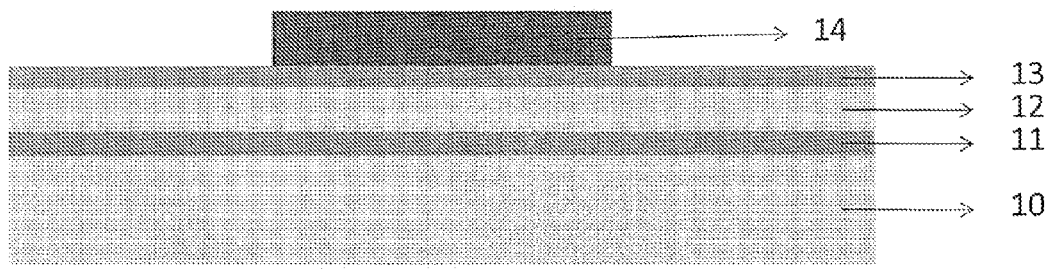
FIGS. 1-6 show schematic views of the semiconductor device at various stages according to embodiments of the present disclosure.

First of all, a substrate 10 having a first semiconductor material is provided, as shown in FIG. 1.

In the present disclosure, the substrate may be a semiconductor substrate. Preferably, the substrate may be a substrate of a singular semiconductor material or a duality substrate, such as Si substrate, Ge substrate, and SiGe substrate. The substrate may comprise a substrate of another element semiconductor or compound semiconductor, such as GaAs, InP or SiC and the like. In the present embodiment, the substrate is a bulk silicon substrate.

Figure 2:
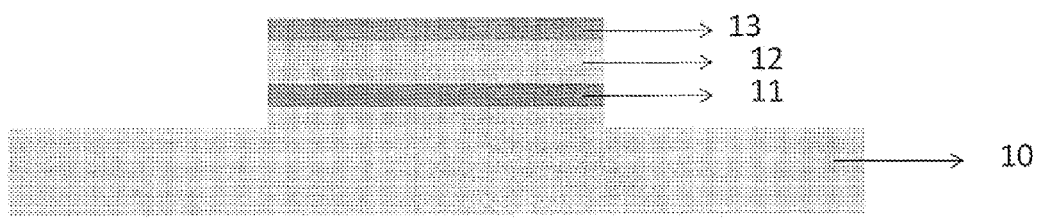

Next, a second semiconductor layer 11 is formed on the substrate, and the third semiconductor layer 12 is formed on the second semiconductor layer 11, as shown in FIG. 2.

In the present embodiment, first of all, and as shown in FIG. 1, a second semiconductor material 11 of $Ge_xSi_{1-x}$ and a third semiconductor material 12 of silicon are epitaxially grown in order on a bulk silicon substrate 10. Then, a hard mask material, such as silicon nitride, is deposited on the third semiconductor material 12, and the photoresist is coated and etched to form a patterned hard mask 13. The photoresist is removed and the pattern of the hard mask is the active region for forming the device. Then, the etching continues under the covering of the hard mask 13 to form a patterned second semiconductor 11 and a patterned third semiconductor layer 12, as shown in FIG. 2.

Figure 3:
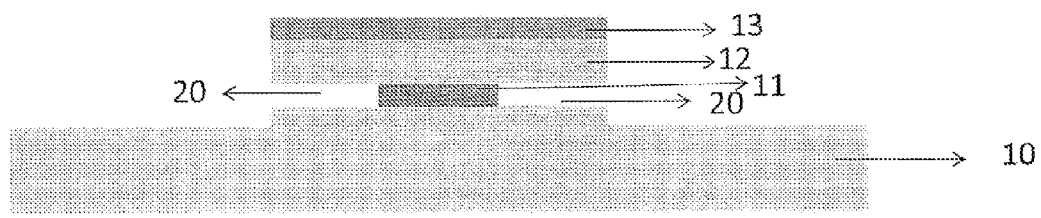

Next, a partial of the second semiconductor layer is removed from one end of the second semiconductor layer 11 so as to form an opening 20, as shown in FIG. 3.

In the present embodiment, a partial of the second semiconductor layer 11 is selectively removed by a wet etching. In particularly, in one preferred embodiment, the etching agent may employ a mixed solution of HF with a concentration of 49%, $H_2O_2$ with a concentration of 30%, $CH_3COOH$ with a concentration of 99.8% and $H_2O$, in a ratio of 1:18:27:8. The second semiconductor layer in the two ends is removed by controlling the etching time. That is to say, there is not a support of the second semiconductor layer below the source and drain regions of the active region, which is a hollow portion.

Figure 4:
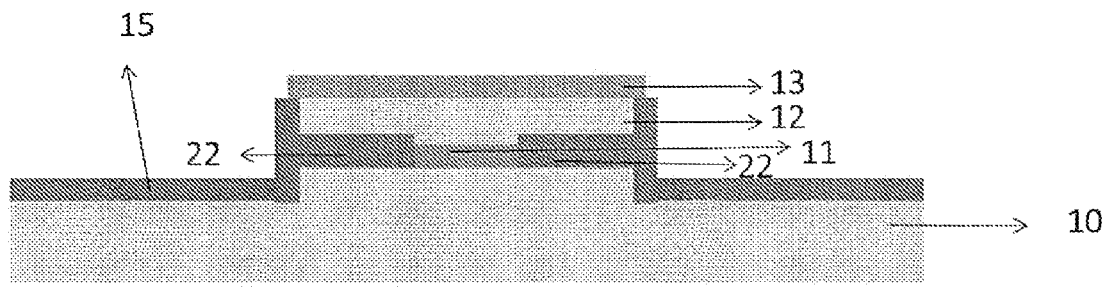

Next, the opening is filled up to form an insulating layer 22, as shown in FIG. 4.

In the present disclosure, an insulating layer of an oxide material is formed by a dry oxidization, such as thermal oxidization. After the thermal oxidization, an insulating layer of the oxide material is formed on the exposed surface of the semiconductor material. That is to say, the insulating layer of the oxide material is formed on the inner wall of the opening, the substrate and the sidewalls of the third semiconductor layer. The time for thermal oxidization is controlled so that the oxidized insulating layer fills up the opening.

Figure 5:
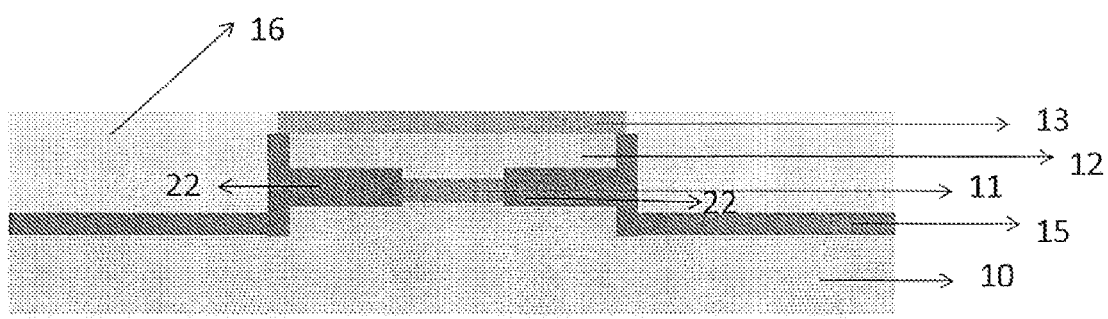

Next, an isolating structure 16 is formed on both sides of the third semiconductor layer 12 and on the substrate, as shown in FIG. 5.

In the present embodiment, the isolation structure 16 may be formed by a conventional process. Firstly, a dielectric material such as silicon oxide may be deposited. Then, a planarization such as Chemical Mechanical Polishing (CMP) is implemented until the surface of the hard mask 13 is exposed. Then, the hard mask 13 is further removed until the surface of the third semiconductor layer 12 is exposed to form the isolation structure 16.

Next, the device is processed to form a semiconductor device 30 on the third semiconductor layer, as shown in FIG. 6.

The device may be formed by a conventional process. In the present embodiment, a CMOS device 30 is formed, as shown in FIG. 6. A well-doping region 32 is formed in the third semiconductor layer 12, the second semiconductor layer 11 and a partial of the substrate 10. A gate structure 33 is formed on the third semiconductor layer 12. A spacer 34 is formed on the sidewalls of the gate structure 33. Source and drain regions 32 are formed in the third semiconductor layer at both sides of the gate, and such source and drain regions 32 are on the insulating layer 22. A metal silicide layer 35 is further formed on the source and drain regions 32. Next, the other components of the device are further formed, such as the contracts for the source and drain regions, the contact for the gate, the interconnecting structure and the like.

The illustration mentioned above is only one embodiment of the present disclosure and is not intended to limit the present disclosure in any aspects.

Although the present disclosure discloses the embodiment as mentioned above, it is not intended to limit the present disclosure. Those skilled in the art may make various change or modification to the technical solution of the present disclosure by utilizing the method and technique as disclosed above or modifies as an equivalent embodiment having substantial identical variation without departing from the scope of the present disclosure. Thus, any simple amendments, identical variation and modification to the above embodiment according to the technique of the present disclosure without departing from the technical solution of the present disclosure fall into the scope of the present disclosure.

We claim:

1. A semiconductor device, comprising:
    a substrate having a first semiconductor material;
    a second semiconductor layer on the substrate;
    a third semiconductor layer on the second semiconductor layer and being a device formation region;
    an isolation structure on both sides of the third semiconductor layer and on the substrate; and
    an insulating layer below source and drain regions of the third semiconductor layer and between the isolation structure and ends of the second semiconductor layer,
    wherein the substrate is a bulk silicon substrate, the second semiconductor is $Ge_xSi_{1-x}$, $0<x<1$, and the third semiconductor layer is silicon.

2. The semiconductor device according to claim 1, wherein the insulating layer is an oxide material, and is further formed between the isolation structure and substrate as well as between the third semiconductor layer and the isolation structure.

3. A method for manufacturing a semiconductor device, comprising steps of:
    providing a substrate having a first semiconductor material;
    forming a second semiconductor layer on the substrate, and forming a third semiconductor layer on the second semiconductor layer;
    removing a portion of the second semiconductor layer from one end of the second semiconductor layer to form an opening;
    filling up the opening to form an insulating layer;
    forming an isolation structure on both sides of the third semiconductor layer and on the substrate;
    wherein the third semiconductor layer is a device formation region, and the opening is below source and drain regions of the third semiconductor layer,
    wherein the substrate is a bulk silicon substrate, the step of forming the second semiconductor layer and the third semiconductor layer comprising:
        epitaxially growing the second semiconductor of $Ge_xSi_{1-x}$ on the substrate, $0<x<1$;
        epitaxially growing the third semiconductor layer of silicon on the second semiconductor layer; and
        patterning the second semiconductor layer and the third semiconductor layer.

4. The method according to claim 3, wherein the step of removing a portion of the second semiconductor layer from one end of the second semiconductor layer to form an opening comprises:
    selectively removing the second semiconductor layer by a wet etching so as to form an opening at ends of the second semiconductor layer.

5. The method according to claim 4, wherein the etchant for the wet etching is a mixed solution of $HF$, $H_2O_2$, $CH_3COOH$ and $H_2O$.

6. The method according to claim 3, wherein the step of forming an insulating layer in the opening comprises:
    oxidizing to form an insulating layer of an oxide material on exposed surfaces of the substrate, the second semiconductor layer and the third semiconductor layer, and the oxide material filling up the opening.

7. A semiconductor device, comprising:
    a substrate having a first semiconductor material;
    a second semiconductor layer on the substrate;
    a third semiconductor layer on the second semiconductor layer and being a device formation region;
    an isolation structure on both sides of the third semiconductor layer and on the substrate; and
    an insulating layer below source and drain regions of the third semiconductor layer and between the isolation structure and ends of the second semiconductor layer,
    wherein the insulating layer is an oxide material, and is further formed between the isolation structure and substrate as well as between the third semiconductor layer and the isolation structure.

8. The semiconductor device according to claim 7, wherein the substrate is a bulk silicon substrate, the second semiconductor is $Ge_xSi_{1-x}$, $0<x<1$, and the third semiconductor layer is silicon.

* * * * *